United States Patent
Matsumoto

(10) Patent No.: US 10,319,909 B2
(45) Date of Patent: Jun. 11, 2019

(54) METHOD FOR MANUFACTURING ORGANIC ELECTRONIC ELEMENT

(71) Applicant: SUMITOMO CHEMICAL COMPANY, LIMITED, Tokyo (JP)

(72) Inventor: Yasuo Matsumoto, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/541,599

(22) PCT Filed: Dec. 18, 2015

(86) PCT No.: PCT/JP2015/085555
§ 371 (c)(1),
(2) Date: Jul. 5, 2017

(87) PCT Pub. No.: WO2016/111144
PCT Pub. Date: Jul. 14, 2016

(65) Prior Publication Data
US 2018/0006222 A1   Jan. 4, 2018

(30) Foreign Application Priority Data
Jan. 7, 2015   (JP) ................................ 2015-001583

(51) Int. Cl.
*H01L 51/00* (2006.01)
*H01L 29/786* (2006.01)
(Continued)

(52) U.S. Cl.
CPC ........ *H01L 51/0004* (2013.01); *H01L 29/786* (2013.01); *H01L 51/0012* (2013.01);
(Continued)

(58) Field of Classification Search
USPC ......................................................... 438/22
See application file for complete search history.

(56) References Cited

U.S. PATENT DOCUMENTS

| 5,136,966 A | 8/1992 | Miyagawa et al. |
| 2006/0162650 A1 | 7/2006 | Kido et al. |

(Continued)

FOREIGN PATENT DOCUMENTS

| CN | 101733258 A | 6/2010 |
| CN | 102848704 A | 1/2013 |

(Continued)

OTHER PUBLICATIONS

Techno Smart Co., Ltd., Multi-layer Die Coater, [online], [Internet Submission accessed on Jun. 26, 2017 (originally Accessed on Nov. 17, 2014)], the Internet URL: http://www.ctiweb.co.jp/soran/products/410, 2014.

(Continued)

*Primary Examiner* — Marcos D. Pizarro
*Assistant Examiner* — Lawrence C Tynes, Jr.
(74) *Attorney, Agent, or Firm* — Sughrue Mion, PLLC

(57) ABSTRACT

A method for manufacturing an organic electronic element capable of reducing unevenness in film thickness of a coating film is disclosed. A method for manufacturing an organic electronic element according to an embodiment of the invention is a method for manufacturing an organic electronic element including a functional layer containing an organic material, including a coating step of forming a functional layer by horizontally conveying a base material (110) having flexibility using a roll-to-roll process and coating a coating solution containing an organic material onto the base material (110) using a slit coat applicator (30) disposed above the base material (110), wherein in the coating step, the base material (110) is floated by air using an air floating stage (20) disposed below the base material (110) and the coating solution is coated onto the base material (110).

8 Claims, 6 Drawing Sheets

(51) Int. Cl.
*H01L 51/50* (2006.01)
*B05D 1/26* (2006.01)

(52) U.S. Cl.
CPC .......... *H01L 51/0097* (2013.01); *H01L 51/50* (2013.01); *B05D 1/26* (2013.01); *B05D 2201/00* (2013.01); *B05D 2252/02* (2013.01); *Y02E 10/549* (2013.01); *Y02P 70/521* (2015.11)

(56) References Cited

U.S. PATENT DOCUMENTS

| 2007/0195653 | A1* | 8/2007 | Yassour ............... B24B 37/30 369/13.24 |
| 2009/0031579 | A1 | 2/2009 | Piatt et al. |
| 2010/0122716 | A1 | 5/2010 | Oh et al. |

FOREIGN PATENT DOCUMENTS

| JP | S64-36077 U | 3/1989 | |
| JP | 2-211270 A | 8/1990 | |
| JP | 2-214564 A | 8/1990 | |
| JP | 2004-66031 A | 3/2004 | |
| JP | 2004066031 * | 3/2004 | |
| JP | 2004-131215 A | 4/2004 | |
| JP | 2004-335492 A | 11/2004 | |
| JP | 2010-140705 A | 6/2010 | |
| JP | 2010140705 * | 6/2010 | ............ H05B 33/10 |
| JP | 2010140705 A * | 6/2010 | ............ H05B 33/10 |
| JP | 2012-192332 A | 10/2012 | |
| JP | 2013-16405 A | 1/2013 | |
| JP | 2014-29883 A | 2/2014 | |
| JP | 2014-79708 A | 5/2014 | |
| JP | 2014-116224 A | 6/2014 | |
| JP | 2014-120350 A | 6/2014 | |
| JP | 2014-180603 A | 9/2014 | |
| JP | 2015-22836 A | 2/2015 | |
| WO | 2010/131580 A1 | 11/2010 | |
| WO | 2012/039218 A1 | 3/2012 | |
| WO | 2012/172919 A1 | 12/2012 | |
| WO | 2013/065429 A1 | 10/2013 | |
| WO | 2013/154076 A1 | 10/2013 | |
| WO | 2016/111145 A1 | 7/2016 | |

OTHER PUBLICATIONS

International Preliminary Report on Patentability (IPRP) including the Written Opinion issued in International Application No. PCT/JP2015/05555 dated Jul. 11, 2017.
Communication from Japanese Office Action dated Jun. 9, 2015 in corresponding Japanese Application No. 2015-001583.
International Search Report dated Mar. 22, 2016 in International Application No. PCT/JP2015/08555.
Communication dated Jun. 4, 2018, from the State Intellectual Property Office of People's Republic of China in counterpart Application No. 201580072619.6.
Extended European Search Report dated Sep. 3, 2018 issued by the European Patent Office in counterpart European application No. 15877017.2.
The Second Office Action dated Feb. 19, 2019, issued by the China National Intellectual Property Administration in counterpart application No. 201580072619.6.

* cited by examiner

METHOD FOR MANUFACTURING ORGANIC ELECTRONIC ELEMENT

This Application is a National Stage of International Application No. PCT/JP2015/085555 filed Dec. 18, 2015, claiming priority based on Japanese Patent Application No. 2015-001583 filed Jan. 7, 2015, the contents of all of which are incorporated herein by reference in their entirety.

TECHNICAL FIELD

The present invention relates to a method for manufacturing an organic electronic element such as an organic EL element, an organic solar cell, and an organic transistor.

BACKGROUND ART

An organic electronic element such as an organic EL (Electro Luminescence) element, an organic solar cell, and an organic transistor is known. Such an organic electronic element includes various functional layers such as a light emitting layer, a hole injection layer, a hole transport layer, an electron transport layer, an electron injection layer, an active layer, a semiconductor layer, and an insulating layer containing an organic material. Such an organic electronic element is formed on a film-shaped substrate (a substrate having flexibility or a flexible substrate) and is formed in a film shape.

As a method for manufacturing the film-shaped organic electronic element, a method for forming various functional layers by a coating method such as an inkjet coating method and a die coater coating method using a roll-to-roll process is known. Non-Patent Literature 1 discloses a die coater coating method (a slit coat coating method).

A case of forming the functional layer in the organic electronic element using the slit coat coating method will be described with reference to FIG. 6. In the slit coat coating method shown in FIG. 6, a film-shaped base material including a substrate is conveyed by a roll-to-roll structure including an unwinding roller 10 and a winding roller 13 and conveying rollers 11, 12, 14, and 15 and a coating solution including an organic material is coated onto the base material by a slit coat applicator 30X, thereby forming a functional layer thin film. At that time, the base material is fixed and stabilized by using a backup roller 15 in order to stabilize an underlying base material.

Fixing and stabilizing an underlying base material by using an adsorption stage instead of the backup roller 15 are also known.

CITATION LIST

Non-Patent Literature

[Non-Patent Literature 1] Techno Smart Co., Ltd., Multilayer Die Coater, [online], [Accessed on Nov. 17, 2014], the Internet <URL:http://www.ctiweb.co.jp/soran/products/410>

SUMMARY OF INVENTION

Technical Problem

The slit coat coating method disclosed in Non-Patent Literature 1 is suitable for a case in which a coating solution having high viscosity is used. Incidentally, there is a case in which a coating solution having low viscosity is used to form a thinner film. However, when the coating solution having low viscosity is used in the slit coat coating method disclosed in Non-Patent Literature 1, dripping occurs.

When the backup roller is used as in the slit coat coating method disclosed in Non-Patent Literature 1, a film thickness becomes uneven due to a mechanical vibration of the backup roller. Meanwhile, since the base material is temporarily adsorbed when the adsorption stage is used, the base material is conveyed intermittently and thus productivity is degraded.

Regarding the dripping, a case in which the base material is horizontally conveyed and a coating solution is coated onto a top surface of the base material by a coater disposed above the base material may be conceived. Regarding the mechanical vibration and the intermittent conveying, a case in which the backup roller and the adsorption stage are not used may be conceived. For example, the substrate may be horizontally conveyed by two conveying rollers separated from each other by a predetermined distance, and a coating solution may be coated onto the top surface of the base material from above between two conveying rollers without using the backup roller and the adsorption stage.

However, in a configuration in which the backup roller and the adsorption stage are not used for the horizontal conveying in the case of the film-shaped base material, the base material droops due to its own weight between two conveying rollers and thus the base material is vibrated up and down. Due to this vibration, the film thickness of the coating film becomes uneven.

Here, the invention is to provide a method for manufacturing an organic electronic element capable of reducing unevenness in thickness of a coating film.

Solution to Problem

A method for manufacturing an organic electronic element of the invention is a method for manufacturing an organic electronic element including a functional layer containing an organic material, including a coating step of forming the functional layer by horizontally conveying a base material having flexibility using a roll-to-roll process and coating a coating solution containing the organic material onto the base material using a slit coat applicator disposed above the base material, wherein in the coating step, the base material is made to float on air using an air floating stage disposed below the base material and the coating solution is coated onto the base material. The coating step can be applied to form various functional layers such as a light emitting layer, a hole injection layer, a hole transport layer, an electron transport layer, an electron injection layer, an active layer, a semiconductor layer, and an insulating layer containing an organic material in an organic electronic element such as an organic EL element, an organic solar cell, and an organic transistor.

According to the method for manufacturing an organic electronic element, since the base material is made to float on air, it is possible to suppress drooping of the base material due to its the own weight and to suppress vertical vibration of the base material. Thus, it is possible to reduce unevenness in film thickness of the coating film caused by the vertical vibration of the base material.

According to the method for manufacturing the organic electronic element, since the base material is horizontally conveyed and the coating solution is coated onto the base material from above, it is possible to prevent dripping when the coating solution has a low viscosity.

According to the method for manufacturing the organic electronic element, since the coating film (functional layer) can be continuously and stably formed in the roll-to-roll process, it is possible to continuously manufacture a high-quality organic electronic element having no unevenness in film thickness of the coating film with high throughput.

The air floating stage may be formed of a porous material. The air floating stage is not used to convey the base material, but is used to float a part of the base material which droops due to its own weight. A relatively large amount of air produced by relatively large holes formed by processing is thus too strong. However, according to the embodiment, it is possible to float a part of the base material which droops due to its own weight by the use of a relatively small amount of air produced by the relatively small holes of the porous material.

A vertical vibration amount (displacement amount) of the base material may be equal to or smaller than 70 μm (±35 μm). According to this embodiment, since the vertical vibration amount of the base material is as small as equal to or smaller than 70 μm (displacement amount of ±35 μm), it is possible to reduce unevenness in film thickness of the coating film caused by the vertical vibration of the base material.

A gap between the air floating stage and the base material may be equal to or larger than 30 μm and equal to or smaller than 1 mm. According to this embodiment, it is possible to appropriately suppress the vertical vibration of the film caused by the blowing air between the air floating stage and the base material. When the gap is smaller than 30 μm, there is a concern that the back surface of the base material may be damaged due to contact between the air floating stage and the base material. In contrast, when the gap is larger than 1 mm, an air layer between the air floating stage and the base material becomes uneven and thus an effect of suppressing the vertical vibration becomes small.

The viscosity of the coating solution may be equal to or larger than 1 cp and equal to or smaller than 20 cp. According to this embodiment, even with a low-viscosity coating solution of equal to or larger than 1 cp and equal to or smaller than 20 cp, it is possible to reduce unevenness in film thickness of the coating film caused by the vertical vibration of the base material. Further, dripping can be prevented as described above.

A tensile force (tension) of the base material may be equal to or larger than 20 N and equal to or smaller than 150 N. According to this embodiment, since wrinkles and slack in the conveying direction do not occur in the film itself conveyed to enter the air floating stage, it is possible to form a stable and uniform coating film while suppressing a vertical vibration.

An air flow speed of the air floating stage may be equal to or greater than 0.001 m/sec and equal to or less than 0.3 m/sec. As described above, the air floating stage is not used to convey the base material, but is used to float a part of the base material which droops due to its own weight. Thus, a relatively large amount of air produced by relatively large holes formed by processing is too strong. However, according to this configuration, since the air flow speed is as low as equal to or greater than 0.001 m/sec and equal to or less than 0.3 m/sec, it is possible to float a part of the base material which droops due to its own weight in the base material.

The organic electronic element may be an organic EL element. According to this embodiment, it is possible to reduce uneven emission luminance (uneven light emission).

The organic electronic element may be an organic solar cell. According to this embodiment, it is possible to select a material in a wide viscosity range for a coating process of an organic semiconductor material or an electrode material formed of metallic nano-particles.

The organic electronic element may be an organic transistor. According to this embodiment, it is possible to select a wide range of materials without considering the viscosity range when an organic semiconductor material for an organic transistor, a material for a gate insulating film, and a printing material formed of metallic nano particles for source/drain electrodes are used.

Advantageous Effects of Invention

According to the invention, it is possible to reduce unevenness in film thickness of a coating film in an organic electronic element such as an organic EL element, an organic solar cell, and an organic transistor.

DESCRIPTION OF EMBODIMENTS

Figure 1:
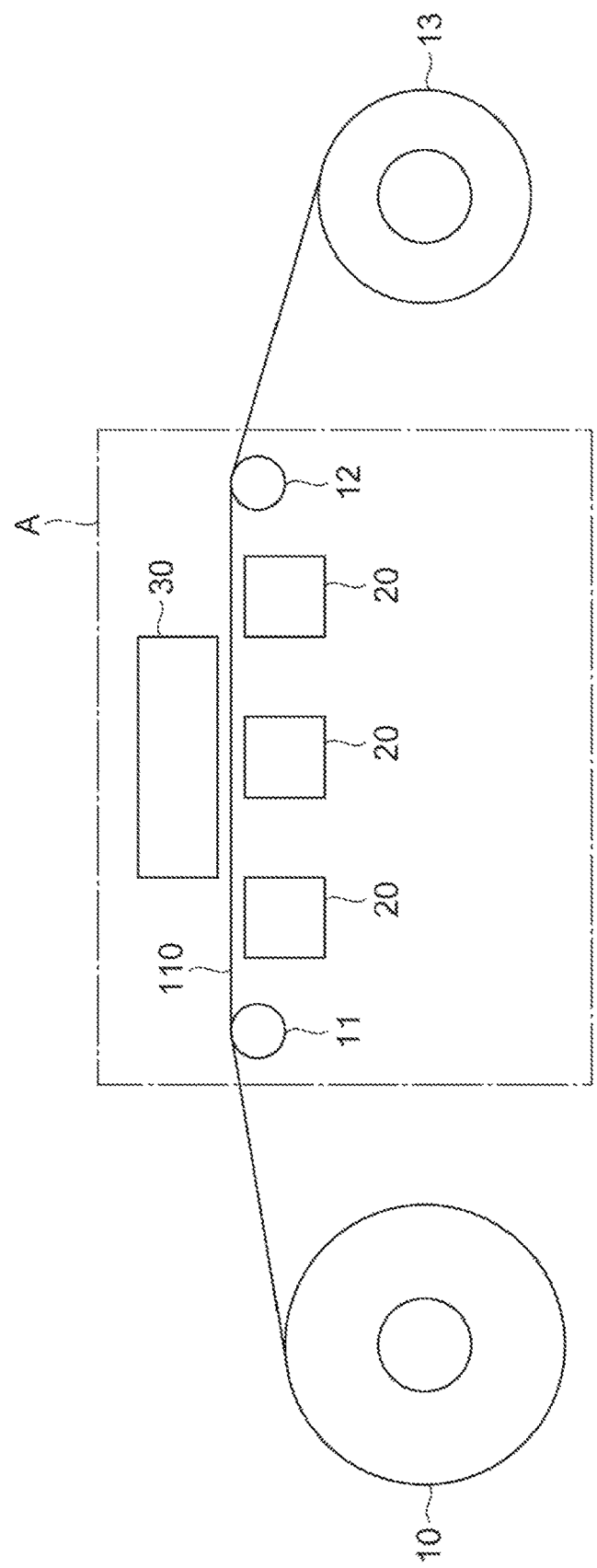
FIG. 1 is a diagram showing a method for manufacturing an organic EL element (organic electronic element) according to an embodiment of the invention.

Hereinafter, a preferred embodiment of the invention will be described in detail with reference to the drawings. In the drawings, the same reference numerals will be given to the same or equivalent parts.

Figure 2:
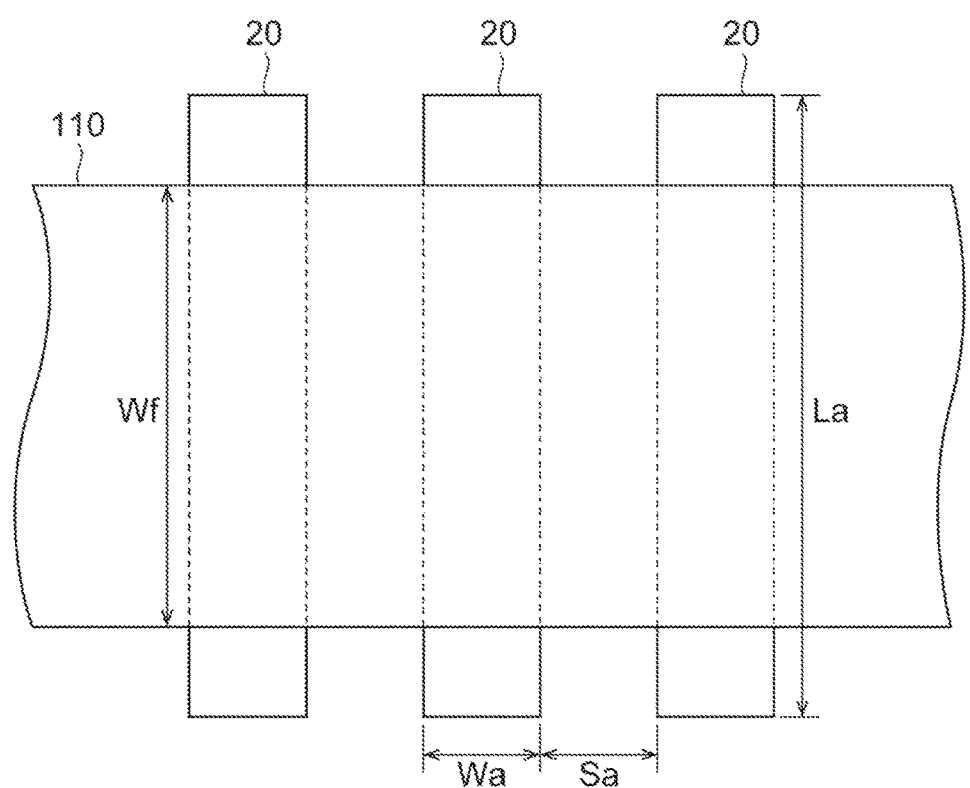
FIG. 2 is a diagram showing a processing area A shown in FIG. 1 when viewed from above.
Figure 3:
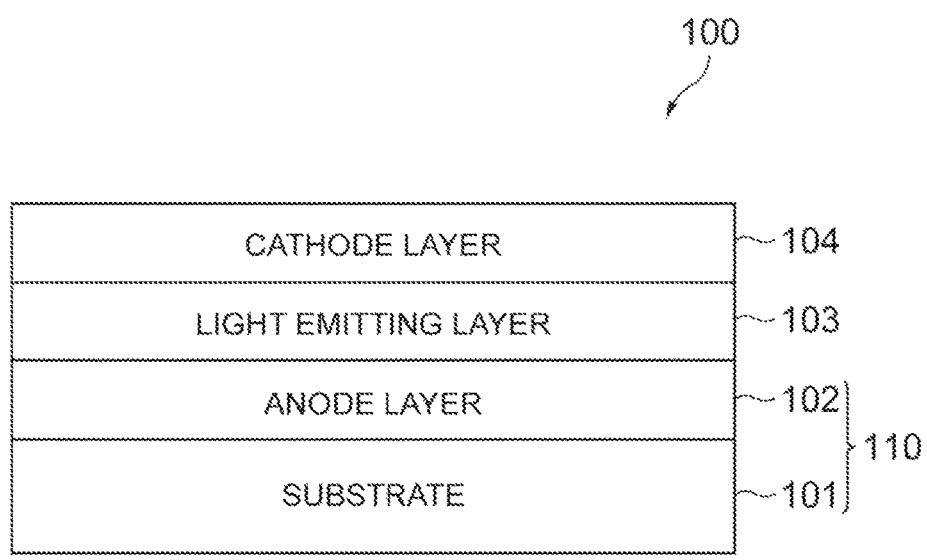
FIG. 3 is a cross-sectional view of the organic EL element (organic electronic element) according to the embodiment.

FIG. 1 is a diagram showing a method for manufacturing an organic EL element (organic electronic element) according to an embodiment of the invention and FIG. 2 is a diagram showing a processing area A shown in FIG. 1 when viewed from above. FIG. 3 is a cross-sectional view of the organic EL element (organic electronic element) according to the embodiment.

As shown in FIG. 3, an organic EL element 100 of the embodiment has a configuration in which an anode layer 102, a light emitting layer (functional layer) 103, and a cathode layer 104 are sequentially laminated on a film-shaped substrate (substrate having flexibility or a flexible substrate) 101. As a material of the film-shaped substrate 101, for example, a transparent plastic, more specifically, PEN (Polyethylene Naphthalate) may be exemplified. For the film-shaped substrate 101, a substrate having a thickness of about 100 μm is typically exemplified. As the anode layer 102, for example, an electrode having light transmittance, more specifically, a conductive metal oxide thin film formed of a relatively transparent material such as ITO (Tin-doped Indium Oxide) and IZO (Indium Zinc Oxide) is exemplified. The light emitting layer 103 includes various known organic EL materials such as a low-molecular-weight type material and a high-molecular-weight type material. As the cathode layer 104, for example, an electrode having light reflectivity, more specifically, a conductive metal thin film formed of a metal material is exemplified.

In a method for manufacturing an organic EL element shown below, a step (coating step) of forming the light emitting layer 103 on a film-shaped base material 110 including the substrate 101 and the anode layer 102 will be described and a known step of forming the anode layer 102 and the cathode layer 104 will be omitted. The anode layer 102 and the cathode layer 104 can be formed by, for example, a known method such as a vapor deposition method and a coating method for forming an electrode layer.

First, as shown in FIGS. 1 and 2, the film base material 110 is horizontally conveyed by the roll-to-roll process. Specifically, the film base material 110 is unwound from the unwinding roller 10, and the film base material 110 is horizontally conveyed in the processing area A by the conveying rollers 11 and 12, and is wound by the winding roller 13.

For example, on the assumption of the PEN film base material 110 having a thickness of 125 μm and a width Wf of 320 mm, a conveying speed of the film base material 110 is set to, for example, be equal to or greater than 2 m/min and equal to or less than 6 in/min and a tension applied in the conveying direction of the film base material 110 is set to, for example, be equal to or larger than 20 N and equal to or smaller than 150 N and desirably equal to or larger than 30 N and equal to or smaller than 100 N. The tension (tensile force) applied in the conveying direction of the film base material 110 may be adjusted by a tension adjusting mechanism (not shown).

In the processing area A in which the film base material 110 is horizontally conveyed, the film base material 110 is floated by air using three air floating stages 20 disposed below the film base material 110. Each of the air floating stages 20 is formed of porous carbon and blows air from a plurality of minute holes. For example, a width Wa of a top surface facing the film base material 110 in the air floating stage 20 is about 100 mm and a length La thereof is about 500 mm. The air floating stages 20 are arranged in the conveying direction at an interval. Sa of 100 mm.

For example, the PEN film base material 110 having a thickness of 125 μm and a width Wf of 320 mm is assumed and an air blowing flow rate is set to be equal to or greater than $1 \times 10^{-4}$ L/(cm²·sec) and equal to or less than $3 \times 10^{-2}$ L/(cm²·sec) (air flow speed conversion which is equal to or greater than 0.001 m/sec and equal to or less than 0.3 m/sec) and desirably equal to or greater than $1 \times 10^{-4}$ L/(cm²·sec) and equal to or less than $1 \times 10^{-2}$ L/(cm²·sec).

Accordingly, a gap between the air floating stage 20 and the film base material 110 is set to be equal to or larger than 30 μm and equal to or smaller than 1 mm and desirably equal to or larger than 50 μm and equal to or smaller than 500 μm. As a result, a vibration amount (highest position minus lowest position) of the film base material 110 is equal to or smaller than 70 μm and desirably equal to or smaller than 40 μm. In other words, a displacement amount of the film base material 110 is equal to or smaller than ±35 μm and desirably equal to or smaller than ±20 μm.

The air floating stage 20 is not used to convey the film base material 110, but is used to float a part of the film base material 110 which droops due to its own weight. Thus, a relatively large amount of air produced by relatively large holes formed by processing is too strong. According to the air floating stage 20 of the embodiment, it is possible to float a part of the film base material 110 which droops due to its own weight by the use of a relatively small amount of air produced by relatively minute holes of the porous material.

In the case of a relatively large amount of air produced by relatively large holes formed by processing, there is a case in which ink of a nozzle of a slit coat applicator 30 to be described later may dry. However, in the case of a relatively small amount of air produced by relatively small holes of the porous material of the embodiment, such a problem does not arise.

In the processing area A in which the film base material 110 is horizontally conveyed, ink (coating solution) including an organic EL material is coated onto the film base material 110 by the slit coat applicator 30 disposed above the film base material 110 and the air floating stage 20 to form the light emitting layer 103. For the light emitting layer 103, a layer having a thickness after drying of 20 nm to 100 nm (for example, a coating thickness of 0.4 μm to 2 μm) is typically exemplified.

The slit coat applicator 30 includes a slit which extends in a direction of the width Wf of the film base material 110.

As the ink, relatively low-viscosity ink having a viscosity which is equal to or larger than 1 cP and equal to or smaller than 20 cP and desirably equal to or larger than 2 cP and equal to or smaller than 10 cP is used. For example, a solution including an organic EL material and an organic solvent is used as the ink. As the organic EL material, a low-molecular-weight type material, a high-molecular-weight type material, or a mixture thereof may be used. The organic solvent may be any solvent as long as the solvent dissolves an organic EL material and is appropriately selected in consideration of the evaporation speed of the solvent, the surface tension and the viscosity of the solution, and the like. As the organic solvent, a single solvent or a mixed solvent may be used.

According to the method for manufacturing the organic EL element (organic electronic element) of the embodiment, since the film base material 110 is floated by air, it is possible to suppress the film base material 110 from drooping due to its own weight and to suppress the vertical vibration of the film base material 110. Thus, it is possible to reduce unevenness in film thickness of the light emitting layer (coating film) caused by the vertical vibration of the film base material 110. As a result, it is possible to reduce uneven light emission luminance (uneven light emission).

According to the method for manufacturing the organic EL element (organic electronic element) of the embodiment, since the film base material 110 is horizontally conveyed and the ink (coating solution) is coated onto the film base material 110 from above, it is possible to prevent dripping when the ink has low viscosity.

Further, according to the method for manufacturing the organic EL element (organic electronic element) of the embodiment, since the coating film (light emitting layer) 103 can be continuously and stably formed in the roll-to-roll process, the film thickness of the coating film is not uneven. As a result, it is possible to continuously manufacture a high-quality organic EL element (organic electronic element) having no uneven emission luminance (uneven light emission) with high throughput.

Hereinafter, the above-described effect will be verified.

[Verification 1]

A light emitting layer was formed in such a manner that an ink (coating solution) containing an organic EL material was coated onto a glass substrate instead of the film base material 110 using an ink jet applicator instead of the slit coat applicator 30. A polymer white light emitting material SCW 140 (having a solid content concentration of 7% and a viscosity of 5 cp) manufactured by Sumitomo Chemical Co., Ltd. was used as an ink and the thickness of the light emitting layer after drying was set to 70 nm. A vertical vibration was applied to the glass substrate when coating the ink thereon. In the present verification, uneven emission luminance (uneven light emission) was visually checked for by irradiating UV rays from an UV lamp to the light emitting layer.

According to this verification, the emission luminance was uneven at a vertical vibration amount (highest position minus lowest position) of 130 µm (displacement amount of ±65 µm) and the emission luminance was even at a vertical vibration amount of 70 µm (displacement amount of ±35 µm) and a vertical vibration amount of 40 µm (±20 µm). From this, it could be understood that uneven emission luminance is reduced, that is, unevenness in film thickness of the light emitting layer (coating film) is reduced at a vertical vibration amount of 70 µm or less, more desirably 40 µm or less, in other words, a vertical displacement amount of ±35 µm or less, more desirably ±20 µm or less.

[Verification 2]

According to the manufacturing method shown in FIGS. 1 and 2, the PEN film base material 110 having a thickness of 125 µm and a width Wf of 320 mm was horizontally conveyed. At that time, comparison verification was performed between a case of performing the air floating using the air floating stage 20 and a case of not performing the air floating. The verification conditions in the case of performing the air floating were as below.

Air blowing flow rate: $3\times10^{-4}$ L/(cm$^2$·sec) (air flow speed conversion: 0.003 m/sec)

Gap between air floating stage 20 and film base material 110: 50 µm.

Further, the other common verification conditions were as below.

Conveying speed of film base material 110: 6 m/min

Tension applied in conveying direction of film base material 110: 30 N

In the present verification, the vertical displacement amount of the film base material 110 was measured by measuring the vertical position of the film base material 110 at intervals of 1 msec for 20 seconds using a laser displacement sensor instead of the slit coat applicator 30. Verification results are shown in FIG. 4.

Figure 4:
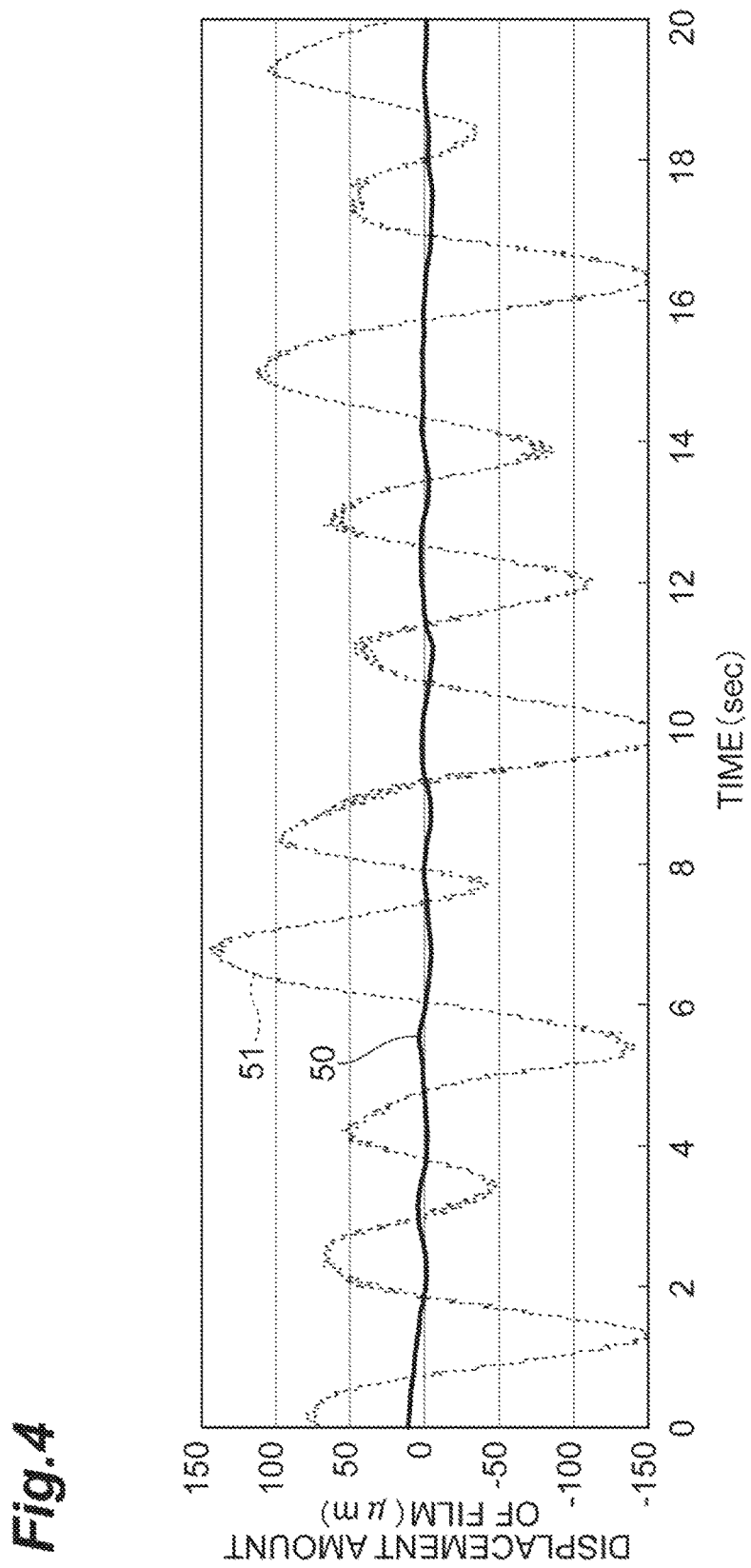
FIG. 4 is a diagram showing verification results.

According to FIG. 4, in the case of not performing the air floating using the air floating stage 20, the vertical vibration amount (highest position minus lowest position) was 315 µm as shown in a curve 51. In contrast, in the case of performing the air floating using the air floating stage 20, the vertical vibration amount was reduced to 17 µm as shown in a curve 50.

From both the verification 1 and the verification 2, it was verified that the uneven emission luminance could be reduced, that is, unevenness in film thickness of the light emitting layer (coating film) could be reduced by the air floating using the air floating stage 20.

The invention is not limited to the above-described embodiment and can be modified into various forms. For example, in the embodiment, a step of coating the light emitting layer of the organic EL element including the light emitting layer (functional layer) between a pair of electrodes has been exemplified. However, features of the invention can also be applied to steps of coating functional layers containing various organic materials, such as a hole injection layer, a hole transport layer, an electron transport layer, and an electron injection layer of various organic EL elements below.

a) Anode/Light Emitting Layer/Cathode b) Anode/Hole Injection Layer/Light Emitting Layer/Cathode c) Anode/Hole Injection Layer/Light Emitting Layer/Electron Injection Layer/Cathode d) Anode/Hole Injection Layer/Light Emitting Layer/Electron Transport Layer/Electron Injection Layer/Cathode e) Anode/Hole Injection Layer/Hole Transport Layer/Light Emitting Layer/Cathode f) Anode/Hole Injection Layer/Hole Transport Layer/Light Emitting Layer/Electron Injection Layer/Cathode g) Anode/Hole Injection Layer/Hole Transport Layer/Light Emitting Layer/Electron Transport Layer/Electron Injection Layer/Cathode h) Anode/Light Emitting Layer/Electron Injection Layer/Cathode i) Anode/Light Emitting Layer/Electron Transport Layer/Electron Injection Layer/Cathode Here, the sign "/" indicates a state where layers which are adjacent to each other with the sign "/" interposed therebetween are laminated on each other.

Figure 5:
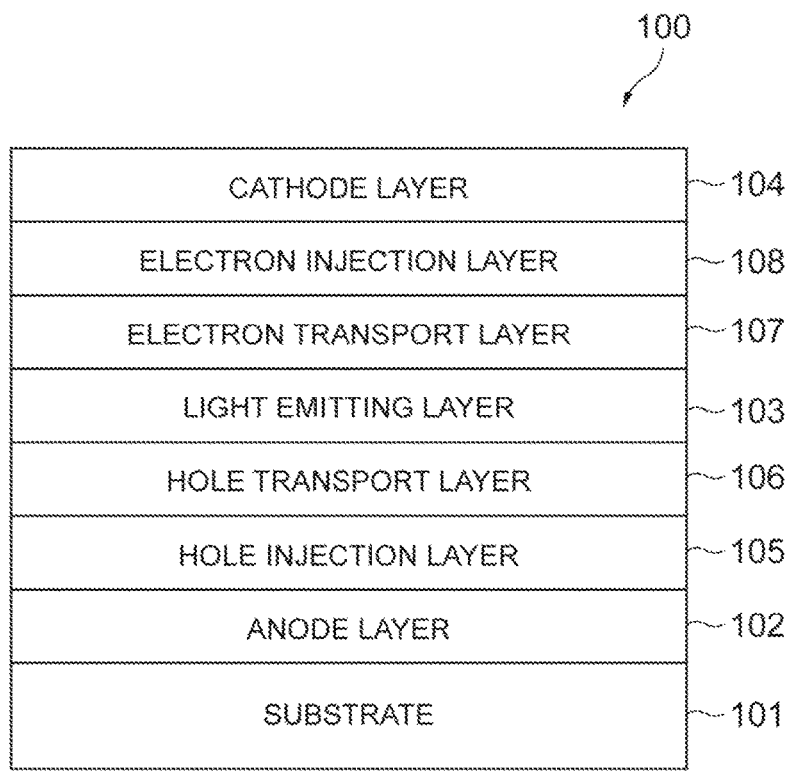
FIG. 5 is a cross-sectional view of an organic EL element (organic electronic element) according to a modified example.
Figure 6:
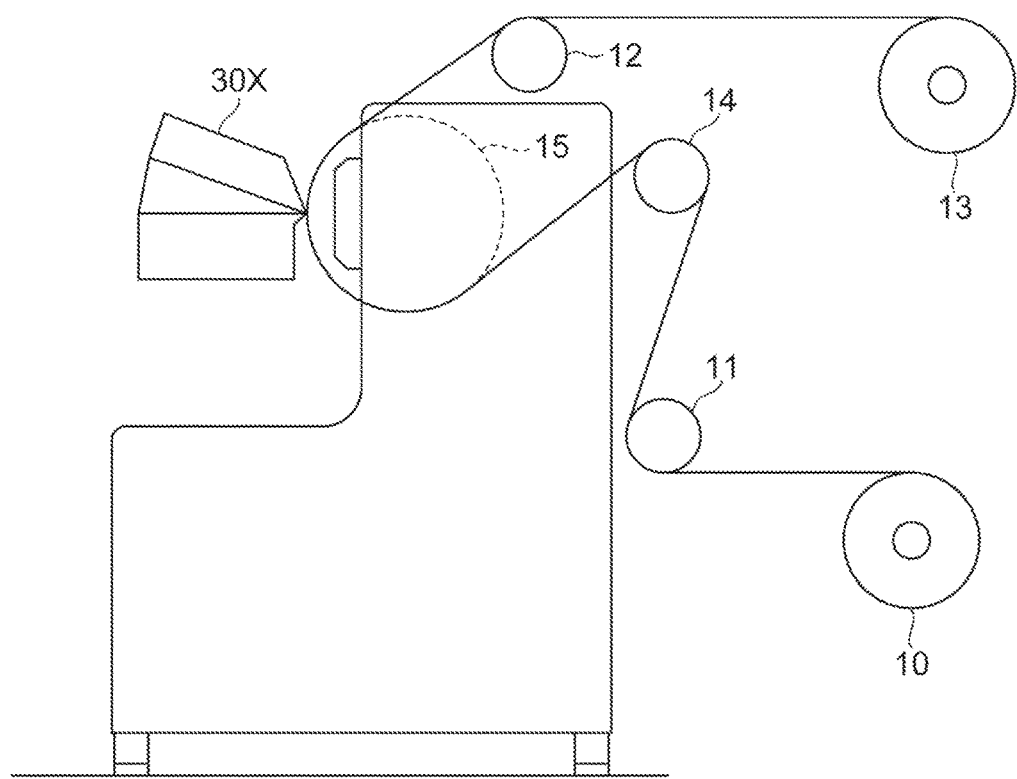
FIG. 6 is a diagram showing a method for manufacturing an organic EL element (organic electronic element) of the related art.

For example, in a step of coating the hole injection layer 105 shown in FIG. 5, the ink (coating solution) containing the organic EL material for the light emitting layer in the step of coating the light emitting layer may be replaced by the ink (coating solution) containing the organic material for the hole injection layer. In a step of coating the hole transport layer 106 shown in FIG. 5, the ink (coating solution) containing the organic EL material for the light emitting layer in the step of coating the light emitting layer may be replaced by the ink (coating solution) containing the organic material for the hole transport layer and further the film base material 110 may be replaced by the film base material including the substrate 101, the anode layer 102, and the hole injection layer 105. In a step of coating the light emitting layer 103 shown in FIG. 5, the film base material 110 may be replaced by the film base material including the substrate 101, the anode layer 102, the hole injection layer 105, and the hole transport layer 106. In a step of coating the electron transport layer 107 shown in FIG. 5, the ink (coating solution) containing the organic EL material for the light emitting layer in the step of coating the light emitting layer may be replaced by the ink (coating solution) containing the organic material of the electron transport layer and further the film base material 110 may be replaced by the film base material including the substrate 101, the anode layer 102, the hole injection layer 105, the hole transport layer 106, and the light emitting layer 103. In a step of coating the electron injection layer 108 shown in FIG. 5, the ink (coating solution) containing the organic EL material for the light emitting layer in the step of coating the light emitting layer may be replaced by the ink (coating solution) containing the organic material of the electron injection layer and further the film base material 110 may be replaced by the film base material including the substrate 101, the anode layer 102, the hole injection layer 105, the hole transport layer 106, the light emitting layer 103, and the electron transport layer 107.

In the embodiment, as a method for manufacturing the organic EL element, a manufacturing method in which the anode layer is disposed on the substrate side relative to the light emitting layer and the cathode layer is disposed on the opposite side to the substrate relative to the light emitting layer has been exemplified. However, features of the invention can also be applied to a manufacturing method in which the cathode layer is disposed on the substrate side relative to the light emitting layer and the anode layer is disposed on the opposite side to the substrate relative to the light emitting layer.

In the embodiment, a method for manufacturing the organic EL element (organic electronic element) has been exemplified. However, features of the invention can also be applied to a method for manufacturing an organic solar cell (organic electronic element) or an organic transistor (organic electronic element). For example, features of the invention can also be applied to a step of forming an active layer (photoelectric conversion layer), a hole injection layer, a hole transport layer, an electron transport layer, and an electron injection layer in the method for manufacturing an organic solar cell. Features of the invention can be also applied to a step of forming a semiconductor layer and an insulating layer in the method for manufacturing an organic transistor.

Features of the invention can be also applied to a manufacturing method in which a barrier layer is formed on any one of or both surfaces of the film base material.

In the embodiment, porous carbon has been exemplified as the material of the air floating stage, but various porous materials capable of blowing air can be employed.

In the embodiment, various conditions such as the air blowing flow rate, the number, the size, and the intervals of the air floating stages, the gap between the air floating stage and the film base material, and the tension applied in the conveying direction of the film base material have been exemplified. However, these conditions are set by assuming a PEN film base material having a thickness of 125 μm and a width of 320 mm. When at least one of the size and the material of the film base material is greatly changed, these conditions may be appropriately changed so that the vertical vibration amount of the film base material becomes equal to or smaller than 70 μm, in other words, the vertical displacement amount becomes equal to or smaller than ±35 μm.

REFERENCE SIGNS LIST

10 Unwinding roller
11, 12, 14 Conveying roller
13 Winding roller
15 Backup roller (conveying roller)
20 Air floating stage
30, 30X Slit coat applicator
100 Organic EL element (organic electronic element)
101 Substrate
102 Anode layer
103 Light emitting layer
104 Cathode layer
105 Hole injection layer
106 Hole transport layer
107 Electron transport layer
108 Electron injection layer
110 Film base material (base material).

The invention claimed is:

1. A method of manufacturing an organic electronic element including a functional layer containing an organic material, comprising:
    a coating step of coating a coating solution containing the organic material onto a base material having flexibility, using a slit coat applicator disposed above the base material, to form the functional layer,
    wherein in the coating step, coating solution is coated onto the base material while the base material is horizontally conveyed using a roll-to-roll process and floated by air using an air floating stage disposed below the base material, and
    wherein a vertical vibration amount of the base material is equal to or smaller than 70 μm, and an air flow speed generated by the air floating stage is equal to or greater than 0.001 m/sec ad equal to or less than 0.3 m/sec.

2. The method of manufacturing the organic electronic element according to claim 1,
    wherein the air floating stage is formed of a porous material.

3. The method of manufacturing the organic electronic element according to claim 1,
    wherein a gap between the air floating stage and the base material is equal to or larger than 30 μm and equal to or smaller than 1 mm.

4. The method of manufacturing the organic electronic element according to claim 1,
    wherein a viscosity of the coating solution is equal to or larger than 1 cp and equal to or smaller than 20 cp.

5. The method of manufacturing the organic electronic element according to claim 1,
    wherein a tensile force of the base material is equal to or larger than 20 N and equal to or smaller than 150 N.

6. The method of manufacturing the organic electronic element according to claim 1,
    wherein the organic electronic element is an organic EL element.

7. The method of manufacturing the organic electronic element according to claim 1,
    wherein the organic electronic element is an organic solar cell.

8. The method of manufacturing the organic electronic element according to claim 1,
    wherein the organic electronic element is an organic transistor.

* * * * *